(12) United States Patent
Foggi et al.

(10) Patent No.: US 8,218,978 B2
(45) Date of Patent: Jul. 10, 2012

(54) MAXIMUM LIKELIHOOD SEQUENCE ESTIMATION IN OPTICAL FIBRE COMMUNICATION SYSTEMS

(75) Inventors: Tommaso Foggi, Parma (IT); Giulio Colavolpe, Parma (IT); Enrico Forestieri, Parma (IT); Giancarlo Prati, Parma (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 665 days.

(21) Appl. No.: 12/295,310

(22) PCT Filed: Nov. 30, 2006

(86) PCT No.: PCT/EP2006/069168
§ 371 (c)(1),
(2), (4) Date: May 26, 2009

(87) PCT Pub. No.: WO2007/112790
PCT Pub. Date: Oct. 11, 2007

(65) Prior Publication Data
US 2009/0317094 A1    Dec. 24, 2009

(30) Foreign Application Priority Data
Apr. 4, 2006 (GB) .................................. 0606745.8

(51) Int. Cl.
*H04B 10/06* (2006.01)

(52) U.S. Cl. ....................................................... 398/208
(58) Field of Classification Search ................. 398/208;
714/795
See application file for complete search history.

(56) References Cited

U.S. PATENT DOCUMENTS

| 5,204,874 | A   |   | 4/1993 | Falconer et al. |
| 7,110,683 | B2 | * | 9/2006 | Bessios .......................... 398/208 |
| 7,738,602 | B2 | * | 6/2010 | Langenbach et al. ......... 375/341 |
| 2001/0017898 | A1 | * | 8/2001 | Raheli et al. ................... 375/262 |

OTHER PUBLICATIONS

Hueda, M. R. et al. "Performance of MLSE-Based Receivers in Lightwave Systems with Nonlinear Dispersion and Amplified Spontaneous Emission Noise." IEEE Global Telecommunications Conference (GLOBECOM-04), Nov. 29-Dec. 3, 2004, pp. 299-303. XP010758899.

* cited by examiner

*Primary Examiner* — Jessica Stultz
*Assistant Examiner* — Tuan Nguyen
(74) *Attorney, Agent, or Firm* — Coats & Bennett, P.L.L.C.

(57) ABSTRACT

A method of and a receiver(20) for detection of a received signal in an optical fiber communication system using Viterbi algorithm methodology in which branch metrics are obtained using approximated expressions to calculate the branch metrics. Use of the expressions results in practically the same performance as a receiver based on exact metrics.

15 Claims, 1 Drawing Sheet

MAXIMUM LIKELIHOOD SEQUENCE ESTIMATION IN OPTICAL FIBRE COMMUNICATION SYSTEMS

FIELD OF INVENTION

This invention relates to a method and apparatus for maximum likelihood sequence estimation (MLSE) in optical fibre communication systems.

BACKGROUND

In recent years, receivers based on sophisticated electronic processing techniques have received much attention in the design of high-speed optical fibre communication systems (40 Gb/s and more). In a linear regime, group velocity dispersion (GVD) and polarization mode dispersion (PMD) are the most severe sources of signal distortion and system penalty. Although the effects of GVD can be compensated by means of dispersion compensating fibres, it is known that tolerance to GVD decreases as the square of the bit rate. Hence, a compensation that would be adequate for 10 Gb/s systems might not be sufficient when upgrading to a higher bit rate because of a non-negligible residual dispersion.

Moreover, the increased sensitivity to engineering tolerances of higher transmission capacity networks can lead to unpredictable and often variable effects on the signal due to residual GVD which, in addition, can combine with the PMD, an intrinsically stochastic phenomenon. In a first order approximation the effect of PMD is considered as a differential group delay (DGD) $\Delta\tau$ between the two principal states of polarization (PSP) of the fibre, resulting in Inter Symbol Interference (ISI).

Usually the PMD is described by a vector $\vec{\Omega}$, which, in a first-order approximation is assumed to be independent of frequency. Higher order effects arise when the PMD vector $\vec{\Omega}$ is frequency dependent. In a common second order approximation, $\vec{\Omega}$ is assumed to be a linear function of the frequency, $\vec{\Omega} = \vec{\Omega}_0 + \vec{\Omega}_1(\omega - \omega_0)$, where $\vec{\Omega}_1$ is the derivative of $\vec{\Omega}$ evaluated at the carrier frequency $\omega_0$. Second order effects are mainly signal distortion and broadening. It has been demonstrated that with different optical compensation techniques such as, for example, a cascade of polarization controllers and polarization maintaining fibres, planar wave guide circuits or other optical devices, it is possible to recover heavy penalties caused by first or second order effects.

The techniques mentioned above, whilst effective, are often impractical because of their cost due to the use of advanced optical technologies. As a consequence much effort has been devoted to apply classical or innovative electrical equalization methods to the case of optical fibre communication systems.

One of the first electrical equalization techniques proposed for optical systems is a Feed Forward Equalizer (FFE) whose purpose is to combat the ISI induced by chromatic dispersion. Non-linear cancellation has also been postulated, since the photo detection process implies a non-linear transformation of the signal. More recently, comparisons between these compensation methods and optical compensation techniques have been presented, showing the benefits and disadvantages of both solutions.

In addition to FFE equalization and decision feedback equalization (DFE) interest is growing for Maximum Likelihood Sequence Estimation (MLSE), realized through the Viterbi algorithm (VA) by virtue of its potentially optimal performance.

In the early Nineties MLSE receivers based on the Viterbi algorithm were proposed for optical fibre systems which did not include the presence of optical amplification. Consequently, the amplified spontaneous emission (ASE) noise introduced by optical amplifiers was not taken into consideration and the statistics of the received signal, required to calculate the branch metrics of the Viterbi algorithm (VA), were assumed to be Gaussian since they are caused by the thermal and shot noise generated after the photo detection process.

In current optical systems optical amplifiers are widely used, hence the signal in the fibre is affected by noise that in the linear regime, can be modelled as additive white Gaussian noise (AWGN). However since the photo detection process performs the action of a square law detector the post detection noise statistic changes and cannot be considered Gaussian any longer. Hence, in the case of MLSE, assuming Gaussian statistics for noise after photo detection is neither realistic nor correct and leads to inaccurate results.

Accordingly, adaptive electric compensation techniques of the PMD based on the MLSE criterion have been proposed in which the statistics of the received signal are measured and updated in real time during transmission using the detected symbols and assuming no decision errors. This method, which assumes specific constraints such as, for example, sample quantization, memory length, filter type and parameters, or even the absence of filtering, has been compared with classical equalization schemes, shows an improved performance.

We have realised that it would be desirable to provide an expression of the VA branch metrics which implements the MLSE criterion for realistic values of the system parameters, whether by sampling the signal with a period equal to the symbol time or at higher rates, given that the oversampling ensures obtaining sufficient statistics of the signal received.

In particular, through numerical evaluation in accordance with a preferred embodiment of the invention, a practically exact expression of the signal statistics is derived in the case of a receiver working at a rate equal to the symbol time.

In the case of oversampling, however, at present there is no expression (exact or approximate) for the statistics of the samples. It is however possible to recur to an adaptive type receiver based on histograms. In accordance with a preferred embodiment of the invention, a method is specified based on an approximate expression in closed form of the VA metrics, which entails a negligible loss of performance compared with an optimal expression.

SUMMARY OF THE INVENTION

According to a first aspect of the present invention there is provided a method of detection of a received signal in an optical fibre communication system using a Viterbi algorithm methodology in which branch metrics are obtained using substantially either of the expressions:

$$\lambda(a_k, \sigma_k) \cong -\frac{v-1}{2}\ln[s_R(a_k, \sigma_k)] - \frac{s_R(a_k, \sigma_k)}{N_0} + \ln\left[I_{v-1}\left(\frac{2\sqrt{z_k s_R(a_k, \sigma_k)}}{N_0}\right)\right]$$

or, $$\lambda(a_k, \sigma_k) \cong 2\sqrt{z_k s_R(a_k, \sigma_k)} - s_R(a_k, \sigma_k) - \frac{N_0}{2}\left(v - \frac{1}{2}\right)\ln[s_R(a_k, \sigma_k)]$$

in which $I_{v-1}$ is the modified Bessel function of the first type and order v−1, $\sigma_k$ is the state of the receiver at the $k^{th}$ bit interval, $s_R(a_k, \sigma_k)$ is the noise-free received sample of the $k^{th}$ bit interval, v is the number of degrees of freedom, $a_k$ is a possible bit transmitted at the $k^{th}$ bit interval, $z_k$ is the sample received at $k^h$ bit interval, $N_0$ is the power spectral density.

According to a second aspect of the invention there is provided a method of detection of a received signal in an optical fibre communication system using a Viterbi algorithm methodology in which branch metrics are obtained using substantially the expression $$\lambda(a_k, \sigma_k) \cong \sum_{i=0}^{1} \ln p(z_{k,i} | a_k, \sigma_k)$$

in which $p(z_{k,i}|a_k,\sigma_k)$ is the probability density function (PDF) of the $i^{th}$ received sample $z_{k,i}$ for the $k^{th}$ bit interval, $\sigma_k$ is a possible bit transmitted at the $k^{th}$ bit interval, and $\sigma_k$ is the state of the receiver at the $k^{th}$ bit interval, and the method further comprising taking multiple samples per bit interval time of the received signal.

According to a further aspect of the invention there is also provided a receiver for an optical transmission system using as sequence detection one of the above methods.

According to yet a further aspect of the invention there is provided a machine-readable data carrier which comprises instructions to implement the method of any of the first and second aspects of the invention when the instructions are loaded onto a data processor.

BRIEF DESCRIPTION OF THE DRAWINGS

Various embodiments of the invention will now be described, by way of example only, in which.

DETAILED DESCRIPTION OF EXEMPLARY EMBODIMENTS

Figure 1:
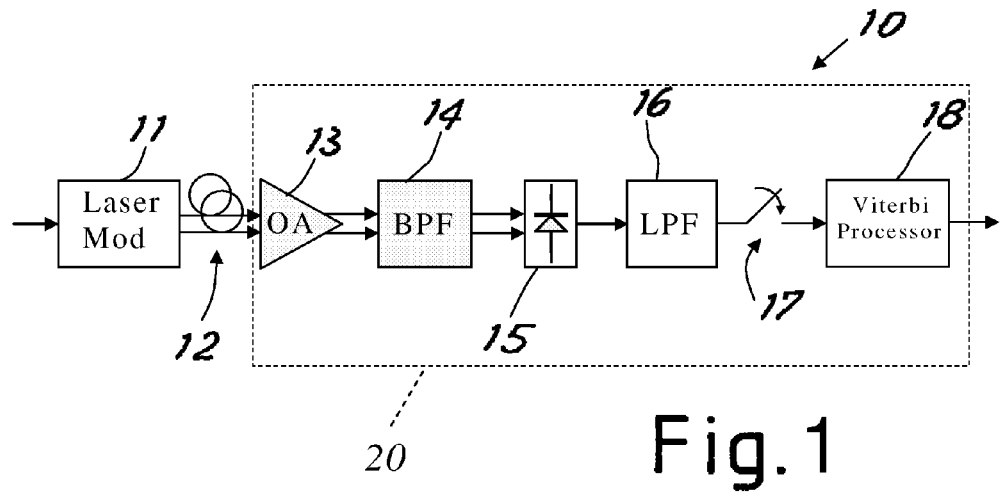
FIG. 1 shows a block diagram of a model of the transmission system considered.

With reference to FIG. 1 there is shown diagrammatically and designated by reference number 10 an optical transmission system which comprises a receiver assembly 20. A signal generated from a standard laser source is modulated by a modulator 11 using on-off keying (OOK) modulation, is transmitted over a single-mode fibre (SMF) 12. The signal is optically amplified at the receiver 20 by an optical amplifier 13 and filtered in the optical domain by a band-pass filter 14. The optical amplifier 13 has a high gain G so that the amplified spontaneous emission (ASE) noise is dominant compared to the thermal and shot noise of the receiver 20.

The optical signal is then converted into the electric domain by a photo detector 15 and the signal thus obtained is filtered electrically by a low-pass filter 16, sampled by a sampler 17, and lastly processed in Viterbi processor 18 by application of the Viterbi algorithm to realize the MLSE strategy. The Viterbi processor 18 comprises data processing means and memory means.

Figure 2:
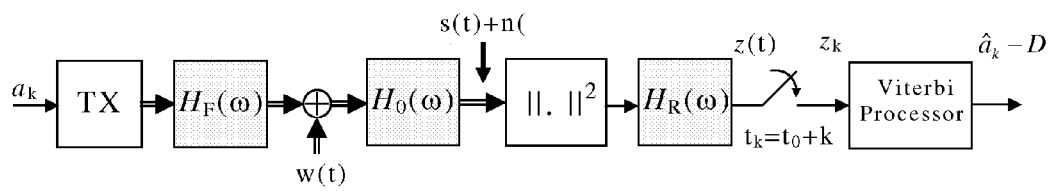
FIG. 2 shows a low-pass equivalent of the system in FIG. 1.

FIG. 2 shows the low-pass equivalent diagram of the system in FIG. 1. The low-pass equivalent transfer functions (matrix) of the fibre and the optical filters and post-detection are indicated respectively as $H_F(\omega)$, $H_O(\omega)$ and $H_R(\omega)$.

The signal $w(t)=[w_1(t),w_2(t)]^T$ represents the additive white Gaussian noise (AWGN) with independent complex noise components $w_1(t)$, $w_2(t)$ responsible for the ASE on the two orthogonal states of polarization (SOP) each with two-sided power spectral density (PSD) equal to $N_0$.

At the output of the optical filter the components of the two-dimensional complex vectors $s(t)=(s_1(t),s_2(t))$ and $\underline{n}(t)=(n_1(t),n_2(t))$ represent respectively the signal components and the useful noise in each SOP. The noise components are Gaussian but not white since they are obtained by filtering of the AWGN $\underline{w}(t)$.

At the output of the photodiode the signal detected can be described as the sum of two contributions, one for each SOP, as follows.

$$y(t)=\|\underline{s}(t)+\underline{n}(t)\|^2=\|s_1(t)+n_1(t)\|^2+\|s_2(t)+n_2(t)\|^2 \quad [1]$$

After photo detection the noise becomes dependent on the signal and its statistics change. Subsequently, since the receiver proposed is independent of a particular choice of filter form and bandwidth, the parameters of the optical filters and post-detection can be chosen arbitrarily.

With the constraints of the described receiver structure 20, and assuming a single sample per bit interval is extracted at the receiver, the optimal MLSE detection strategy can be expressed as follows:

$$\hat{a} = \arg\max_{\underline{a}} p(\underline{z} | \underline{a}) \quad [2]$$

in which $\underline{a}=\{a_k\}$ is a possible transmitted bit sequence and with $\underline{z}=\{\overline{z_k}\}$ the related received sequence.

The samples received are $z_k=z(t_0+kT)$, $t_0$ being an adapted time delay (offset) and T the bit interval.

It is assumed that, conditionally upon the transmitted sequence, the samples $\{z_k\}$ can be considered independently. This assumption was verified numerically for optical and electrical filters of commonly used band, form, and amplitude. Hence, the combined probability density function (PDF) $p(\underline{z}|\underline{a})$ of the received samples, conditioned to the transmitted symbols, can be written as follows $$p(\underline{z} | \underline{a}) = \prod_k p(z_k | \underline{a}) \quad [3]$$

and, assuming that the system is causal and with finite memory L, the following can be written.

$$p(z_k|\underline{a})=p(z_k|a_{k-1}, \ldots, a_{k-L}) \quad [4]$$

Therefore, the optimal MLSE strategy can be realized by means of the Viterbi algorithm using the following branch metrics.

$$\lambda_k(a_k,\sigma_k)=\ln p(z_k \oplus a_k, \sigma_k) \quad [5]$$

where $\sigma_k=(a_{k-1}, a_{k-2}, \ldots, a_{k-L})$ identifies the state of the receiver on the trellis diagram (trellis state). Consequently, the number of states is $S=2^L$ and therefore the complexity of the receiver increases exponentially with the channel memory L.

A closed form expression for the PDF in [4] is not known for an arbitrary signal format and filtering. In fact, despite the samples at the output of the photo detector, are characterized by a non-central chi-square distribution being the sum of squared Gaussian random variables, the presence of the electrical filter modifies such statistics.

We have realised that an appropriate characterization of this PDF would be beneficial in order to avoid the performance of the Viterbi processor being degraded. This PDF can be evaluated almost exactly by means of numerical methods and stored in a look-up table which can be addressed in order to calculate the branch metrics, from the received signal samples and from the transitions between the trellis states considered. This enables a comparison to be made between the exact values and the values resulting from the approximate expressions set out below.

The most efficient numerical method to obtain the PDF in [4] is based on the knowledge of the moment generating function $\Psi_{z_k|\underline{a}}(s)$ of the samples, whose expression in closed form can be obtained by expanding the noise on a proper Karhunen-Loève basis. Then, using the saddle-point approximation, the PDF can be evaluated as follows.

$$p(z_k \mid \underline{a}) \cong \frac{\exp[\Phi_{z_k|\underline{a}}(s_0)]}{\sqrt{2\pi\Phi''_{z_k|\underline{a}}(s_0)}} \qquad [6]$$

where $s_0$ is the saddle-point of $\Psi_{z_k|\underline{a}}(s)\exp(-sz_k)$ on the real axis, $$\Phi_{z_k|\underline{a}}(s) = \log[\Psi_{z_k|\underline{a}}(s)e^{-sz_k}] \qquad [7]$$

and $\Phi''_{z_k|\underline{a}}$ is the second derivative of $\Phi_{z_k|\underline{a}}$ which is always positive at the saddle-point.

This approach, although giving an extremely accurate closed form approximation for the PDF, requires a search for the saddle-point. However this is a simple and rapid process, easily imaginable to one skilled in the art.

It was verified that it is possible to approximate the conditional PDF of the received sample (and hence the branch metrics expression) as follows:

$$p(z_k \mid a_k, \sigma_k) \cong \frac{1}{N_0} \left( \frac{z_k}{s_R(a_k, \sigma_k)} \right)^{(v-1)/2} \times \qquad [8]$$

$$\exp\left(-\frac{z_k + s_R(a_k, \sigma_k)}{N_0}\right) I_{v-1}\left(\frac{2\sqrt{z_k s_R(a_k, \sigma_k)}}{N_0}\right)$$

where the number of degrees of freedom $v$ is given by the ratio of the optical and electrical filter noise equivalent bandwidths, $S_R(a_k \sigma_k)$ is the noise-free received sample, which is estimated using known methodology, which depends on the present and past transmitted symbols, according to the length of the channel memory, and $I_{v-1}(x)$ is a modified Bessel function of the first kind and order $v-1$. All terms in the branch metrics independent from $a_k$ and $\sigma_k$ can be ignored and, in addition, the branch metrics can be arbitrarily multiplied by a positive constant. Hence, ignoring the irrelevant terms in the maximization, and inserting [8] into [5], a simplified expression of the branch metrics is given by:

$$\lambda(a_k, \sigma_k) \cong \qquad [9]$$

$$-\frac{v-1}{2}\ln[s_R(a_k, \sigma_k)] - \frac{s_R(a_k, \sigma_k)}{N_0} + \ln\left[I_{v-1}\left(\frac{2\sqrt{z_k s_R(a_k, \sigma_k)}}{N_0}\right)\right]$$

Advantageously when the processor 18 is configured to implement [9] to calculate the branch metrics this results in practically the same performance as a receiver based on exact metrics.

It is to be noted that [8] is used both when $a_k=1$ or when $a_k=0$, since, given the finite extinction ratio, filtering and signal $s_R(a_k, \sigma_k)$ distortion, is not exactly equal to zero even when $a_k=0$. Clearly when $a_k=0$, [8] is accurate only if the electrical filter impulse response is always positive or if any negative values have a negligible impact such as for example in the case of Gaussian or Bessel type filters.

A further simplification of the branch metrics of [9] can be obtained using the following crude approximation:

$$I_{v-1}(x) \cong \frac{e^x}{\sqrt{2\pi x}}$$

by means of which [8] is further approximated as:

$$p(z_k \mid a_k, \sigma_k) \cong \frac{\exp\left(-\frac{(\sqrt{z_k} - \sqrt{s_R})^2}{N_0} + \left(v - \frac{3}{2}\right)(\sqrt{z_k} - 1)\right)}{\sqrt{4\pi N_0 s_R^{v-1/2}}} \qquad [10]$$

The resulting branch metrics are thus:

$$\lambda(a_k, \sigma_k) \cong 2\sqrt{z_k s_R(a_k, \sigma_k)} - s_R(a_k, \sigma_k) - \frac{N_0}{2}\left(v - \frac{1}{2}\right)\ln[s_R(a_k, \sigma_k)] \qquad [11]$$

In use the processor of the receiver assembly 20 is configured to determine estimates of the values of $S_R(a_k, \sigma_k)$ for each received sample in respect of each pair $(a_k, \sigma_k)$. The processor is then operative to use either expression [9] or [11] to calculate each corresponding branch metric and then use the branch metrics in the Viterbi algorithm to reach a decision.

As already mentioned, the number of trellis states and hence the complexity of the receiver depends exponentially on the channel memory L.

In addition, the application of reduced-state sequence detection (RSSD) techniques allows a substantial reduction of the number of trellis states.

In particular, a reduced state can be defined $\sigma'_k=(a_{k-1}, a_{k-2}, \ldots, a_{k-L'})$, with $L'<L$. The resulting number of states is therefore reduced to $2^{L'}<2^L$. For the purpose of calculating the branch metrics [5] in the case of reduced trellis, the necessary symbols, not included in the state definition, can be found in the survivor history of the path according to known techniques.

It is noted that in the limiting case of $L'=0$ the trellis diagram degenerates and a detection is obtained using symbol-by-symbol with decision feedback. The resulting receiver can be considered as a non-linear equalizer with decision feedback.

Since the PMD is a time-varying phenomenon, the values of $s_R(a_k, \sigma_k)$ should be updated adaptively. As a change in the PMD occurs, the receiver must merely identify in an adaptive manner the term $s_R(a_k, \sigma_k)$, employed in the closed form expressions of the above mentioned branch metrics [9] or [11]. This can be easily done using a gradient adaptation algorithm using as cost function the expression of the branch metrics or the mean square error.

Although the MLSE receiver in accordance with this invention is the best post-detection technique in the case of synchronous sampling, one sample per bit time may not represent a sufficient statistic, because of the non-linear nature introduced by the photodiode 15. A sufficient statistic can be obtained by over-sampling as explained below with reference to FIG. 3.

Assuming that n samples are used per bit time (signalling interval) the following notation will be used to indicate the received samples. The n received samples in the $k^{th}$ bit interval will be indicated as $z_{k,i} = z(t_0 + kT + iT/n)$, $i = 0, 1, \ldots, n-1$. As previously, the received sequence is indicated with $\underline{z} = \{z_{k,i}\}$. In addition, the n signal samples related to the $k^{th}$ bit are indicated with $\underline{z}_k$, that is to say $\underline{z}_k = \{z_{k,i}\}_{i=0}^{n-1}$.

When the samples are spaced at intervals less than the bit time (always conditioned to the sequence of symbols transmitted, namely the transmitted bit sequence) they cannot be considered as independent. Consequently, their joint PDF cannot be expressed as the product of the marginal PDFs. For this reason, the chain rule is used to factorize the joint PDF $p(\underline{z}|\underline{a})$ necessary to implement the MLSE strategy. Assuming as above that the received samples which differ by at least one bit interval are independent, we have:

$$p(\underline{z}|\underline{a}) = \prod_k p(\underline{z}_k | \underline{z}_{k-1}, \underline{a}) \qquad [12]$$

$$= \prod_k \prod_{i=0}^{n-1} p(z_{k,i} | z_{k,i-1}, \ldots, z_{k,0}, \underline{z}_{k-1}, \underline{a})$$

where in the last expression, it is implicitly assumed that in case $i=0$, then the terms $z_{k,i-1}, \ldots, z_{k,0}$ all disappear. Hence, with an appropriate definition of the receiver state $\sigma_k$, the branch metrics of the Viterbi algorithm implementing the MLSD strategy can be calculated as follows:

$$\lambda(a_k, \sigma_k) = \ln p(\underline{z}_k | \underline{z}_{k-1}, a_k, \sigma_k) \qquad [13]$$

$$= \prod_{i=0}^{n-1} \ln p(z_{k,i} | z_{k,i-1}, \ldots, z_{k,0}, \underline{z}_{k-1}, a_k, \sigma_k)$$

Figure 3:
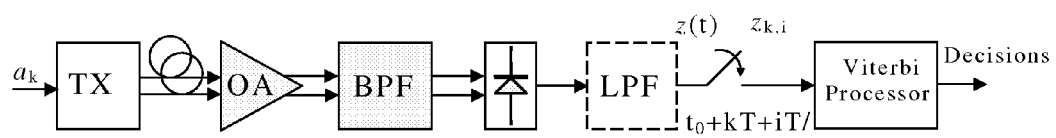
FIG. 3 shows a block diagram of a model of the transmission system considered in the case of a receiver based on over-sampling.

Thus, in the case of over sampling, the system memory will be M≧L. In this case the state is defined as $\sigma_k = (a_{k-1}, a_{k-2}, \ldots, a_{k-M})$. The structure of this receiver in the case of over sampling (n>1) is shown in FIG. 3.

It has been determined that a value of n=2 is sufficient in practice to obtain optimal performance. In this case, although there is a correlation between the received samples, considering them as independent in the expression of the branch metrics does not deteriorate the performance obtained using the optimal correlated metrics. Therefore, the simplified branch metrics below can be used without deterioration of the receiver performance.

$$\lambda(a_k, \sigma_k) \cong \sum_{i=0}^{1} \ln p(z_{k,i} | a_k, \sigma_k) \qquad [14]$$

where $p(z_{k,i}|a_k, \sigma_k)$ is given by [6]. The PDFs which appear in [14] can be further simplified using the approximate expression [8] or [10] as easily imaginable for one skilled in the art.

The above described embodiments advantageously provide an extremely robust and efficient method of implementing the Viterbi algorithm. Advantageously there is no requirement to store a look-up table with various PDF values which need to be addressed. Use of such look-up tables can require significant memory and processing capabilities. Rather, by use of the above expressions the branch metrics can be determined quickly and accurately without requiring overly substantial processing and storage means.

Naturally the above description of embodiments applying the innovative principles of this invention are given by way of non-limiting example of said principles within the scope of the exclusive right claimed here.

The invention claimed is:

1. A method of detecting a received signal in an optical fiber communication system using Viterbi algorithm methodology, the method comprising:
    amplifying the received signal by an optical amplifier;
    converting the received signal into an electrical signal by a photon detector;
    decoding the electrical signal by a processor using a Viterbi algorithm comprising the following expression of Viterbi branch metrics:

$$\lambda(a_k, \sigma_k) \cong 2\sqrt{Z_k S_R(a_k, \sigma_k)} - S_R(a_k, \sigma_k) - \frac{N_0}{2}\left(v - \frac{1}{2}\right)\ln[S_R(a_k, \sigma_k)],$$

wherein:
    $\sigma_k$ is the state of the receiver at the $k^{th}$ bit interval;
    $S_R(a_k, \pi_k)$ is the substantially noise-free received sample at the $k^{th}$ bit interval;
    v is the number of degrees of freedom;
    $a_k$ is a possible value of the bit transmitted at the $k^{th}$ bit interval;
    $Z_k$ is the sample received at $k^{th}$ bit interval; and
    $N_0$ is the power spectral density.

2. The method of claim 1 further comprising determining estimates of $S_R(a_k, \sigma_k)$.

3. The method of claim 2 further comprising determining estimates of $S_R(a_k, \sigma_k)$ for each pair $(a_k, \sigma_k)$.

4. The method of claim 1 further comprising obtaining samples at a rate of substantially one per bit interval.

5. The method of claim 1 further comprising determining values of $S_R(a_k, \sigma_k)$ using a gradient algorithm as a cost function of the branch metrics.

6. The method of claim 1 further comprising determining values of $S_R(a_k, \sigma_k)$ using mean square error methodology.

7. A method of detecting a signal received in an optical fiber communication system using the Viterbi algorithm, the method comprising:
    optically amplifying the received signal by an optical amplifier;
    converting the received signal into an electrical signal by a photon detector;
    decoding the electrical signal by a processor using a Viterbi algorithm comprising the following expression of Viterbi branch metrics:

$$\lambda(a_k, \sigma_k) \cong \sum_{i=0}^{1} \ln p(Z_{k,i} | a_k, \sigma_k); \text{ and}$$

obtaining multiple samples of the received signal per bit interval time;
wherein:
$p(Z_{k,i}|a_k,\sigma_k)$ is the probability density function (PDF) of the received sample $Z_{k,i}$;
$a_k$ is the bit transmitted at the $k^{th}$ bit interval; and
$\sigma_k$ is the state of the receiver at the $k^{th}$ bit interval.

8. The method of claim 7 further comprising determining the probability density functions $p(Z_{k,i}|a_k,\sigma_k)$ using the following expression:

$$p(Z_{k,i} | a_k, \sigma_k) \cong \frac{\exp\left(-\frac{(\sqrt{Z_{k,i}} - \sqrt{S_{R,i}})^2}{N_0}\right) + \left(v - \frac{3}{2}\right)(\sqrt{Z_{k,i}} - 1)}{\sqrt{4\pi N_0 S_{R,i}^{v-1/2}}},$$

wherein:
$N_0$ is the power spectral density; and
$S_{R,i}(a_k,\sigma_k)$ is the $i^{th}$ substantially noise-free received sample of the $k^{th}$ bit interval.

9. The method of claim 7 further comprising obtaining substantially two samples of the received signal per bit interval time.

10. The method of claim 8 further comprising determining values of $S_R(a_k,\sigma_k)$ using a gradient algorithm as a cost function of the branch metrics.

11. The method of claim 8 further comprising determining values of $S_{R,i}(a_k,\sigma_k)$ using mean square error methodology.

12. A receiver for an optical transmission system, the receiver comprising:
an optical amplifier for amplifying a received optical signal;
a photon detector for converting the received optical signal into an electrical signal; and
a decoder configured to decode the received signal in an optical fiber communication system using a Viterbi algorithm methodology by:
obtaining branch metrics using the following expression:

$$\lambda(a_k, \sigma_k) \cong 2\sqrt{Z_k S_R(a_k, \sigma_k)} - S_R(a_k, \sigma_k) - \frac{N_0}{2}\left(v - \frac{1}{2}\right)\ln[S_R(a_k, \sigma_k)],$$

wherein:
$\sigma_k$ is the state of the receiver at the $k^{th}$ bit interval;
$S_R(a_k,\sigma_k)$ is the substantially noise-free received sample at the $k^{th}$ bit interval;
$v$ is the number of degrees of freedom;
$a_k$ is a possible value of the bit transmitted at the $k^{th}$ bit interval;
$Z_k$ is the sample received at $k^{th}$ bit interval; and
$N_0$ is the power spectral density.

13. A receiver for an optical transmission system, the receiver comprising:
an optical amplifier for amplifying a received optical signal;
a photon detector for converting the received optical signal into an electrical signal; and
a decoder configured to detect a received signal in an optical fiber communication system using Viterbi algorithm methodology by:
obtaining branch metrics using the expression:

$$\lambda(a_k, \sigma_k) \cong \sum_{i=0}^{1} \ln p(Z_{k,i} | a_k, \sigma_k); \text{ and}$$

obtaining multiple samples of the received signal per bit interval time;
wherein:
$p(Z_{k,i}|a_k,\sigma_k)$ is the probability density function (PDF) of the received sample $Z_{k,i}$;
$a_k$ is the bit transmitted at the $k^h$ bit interval; and
$\sigma_k$ is the state of the receiver at the $k^{th}$ bit interval.

14. A non-transitory machine-readable medium comprising machine-readable instructions for decoding a received signal in an optical fiber communication system using Viterbi Algorithm by:
determining a power spectral density ($N_0$);
computing a substantially noise-free received sample for each bit interval ($S_R(a_k,\sigma_k)$); and
decoding the received signal using a Maximum Likelihood Sequence Detection algorithm by using the following expression of Viterbi branch metrics:

$$\lambda(a_k, \sigma_k) \cong 2\sqrt{Z_k S_R(a_k, \sigma_k)} - S_R(a_k, \sigma_k) - \frac{N_0}{2}\left(v - \frac{1}{2}\right)\ln[S_R(a_k, \sigma_k)],$$

wherein;
$\sigma_k$ is the state of the receiver at the $k^{th}$ bit interval;
$S_R(a_k,\sigma_k)$ is the substantially noise-free received sample at the $k^{th}$ bit interval;
$v$ is the number of degrees of freedom;
$a_k$ is a possible value of the bit transmitted at the $k^{th}$ bit interval;
$Z_k$ is the sample received at $k^{th}$ bit interval; and
$N_0$ is the power spectral density.

15. A non-transitory machine-readable medium comprising machine-readable, instructions for decoding a received signal in an optical fiber communication system using Viterbi algorithm methodology by:
obtaining multiple samples of the received signal per bit interval time ($Z_{k,i}$);
calculating a probability density function $p(Z_{k,i}|a_k,\sigma_k)$ for each of the multiple samples of the received signal; and
obtaining branch metrics using the expression:

$$\lambda(a_k, \sigma_k) \cong \sum_{i=0}^{1} \ln p(Z_{k,i} | a_k, \sigma_k);$$

wherein:
$p(Z_{k,i}|a_k,\sigma_k)$ is the probability density function (PDF) of the received sample $Z_{k,i}$;
$a_k$ is the bit transmitted at the $k^{th}$ bit interval; and
$\sigma_k$ is the state of the receiver at the $k^{th}$ bit interval.

* * * * *

UNITED STATES PATENT AND TRADEMARK OFFICE
CERTIFICATE OF CORRECTION

PATENT NO.        : 8,218,978 B2
APPLICATION NO.   : 12/295310
DATED             : July 10, 2012
INVENTOR(S)       : Foggi et al.

It is certified that error appears in the above-identified patent and that said Letters Patent is hereby corrected as shown below:

In Column 3, Line 13, delete "$k^h$" and insert -- $k^{th}$ --, therefor.

In Column 3, Line 26, delete "$\sigma_k$" and insert -- $a_k$ --, therefor.

In Column 4, Line 25, in Equation [1], delete "$=\|s_1$" and insert -- $=|s_1$ --, therefor.

In Column 4, Line 65, in Equation [5], delete "$p(z_k \oplus a_k, \sigma_k)$" and insert -- $p(z_k | a_k, \sigma_k)$ --, therefor.

In Column 7, in Equation [13], Line 2, delete "$\prod_{i=0}^{n-1}$" and insert -- $\sum_{i=0}^{n-1}$ --, therefor.

In Column 7, Line 57, delete "$a_{k-M}$))." and insert -- $a_{k-M}$). --, therefor.

In Column 8, Line 40, in Claim 1, delete "$\pi_k$)" and insert -- $\sigma_k$) --, therefor.

In Column 10, Line 16, in Claim 13, delete "$k^h$" and insert -- $k^{th}$ --, therefor.

In Column 10, Lines 20-21, in Claim 14, delete "using Viterbi Algorithm" and insert -- using a Viterbi algorithm --, therefor.

In Column 10, Line 44, in Claim 15, delete "machine-readable," and insert -- machine-readable --, therefor.

Signed and Sealed this
Twenty-seventh Day of November, 2012

David J. Kappos
*Director of the United States Patent and Trademark Office*